(12) United States Patent
Murakami et al.

(10) Patent No.: US 8,052,861 B2
(45) Date of Patent: Nov. 8, 2011

(54) ELECTROLYTIC ETCHING METHOD AND METHOD OF PRODUCING A SOLAR BATTERY

(75) Inventors: Tsutomu Murakami, Nagahama (JP); Koji Tsuzuki, Hikone (JP)

(73) Assignee: Canon Kabushiki Kaisha, Tokyo (JP)

( * ) Notice: Subject to any disclaimer, the term of this patent is extended or adjusted under 35 U.S.C. 154(b) by 25 days.

(21) Appl. No.: 12/707,430

(22) Filed: Feb. 17, 2010

(65) Prior Publication Data

US 2010/0140104 A1    Jun. 10, 2010

Related U.S. Application Data

(62) Division of application No. 10/998,617, filed on Nov. 30, 2004, now Pat. No. 7,691,241.

(30) Foreign Application Priority Data

Dec. 1, 2003  (JP) .................................. 2003-401420
Nov. 5, 2004  (JP) .................................. 2004-321641

(51) Int. Cl.
*C25F 3/14*    (2006.01)
(52) U.S. Cl. .................................. 205/652; 204/224 M
(58) Field of Classification Search .................. 205/652; 204/224 R
See application file for complete search history.

(56) References Cited

U.S. PATENT DOCUMENTS

| 5,780,163 | A | * | 7/1998 | Camilletti et al. ............ 428/446 |
| 5,863,412 | A | | 1/1999 | Ichinose et al. |
| 5,993,637 | A | | 11/1999 | Hisamatsu et al. |
| 6,051,116 | A | | 4/2000 | Ichinose et al. |
| 6,491,808 | B2 | | 12/2002 | Ichinose et al. |
| 7,604,729 | B2 | | 10/2009 | Lee et al. |

FOREIGN PATENT DOCUMENTS

| JP | 56-091000 A | 7/1981 |
| JP | 9-115877 A | 5/1997 |
| JP | 11-162931 A | 6/1999 |
| JP | 2002-227000 A | 8/2002 |

* cited by examiner

*Primary Examiner* — Alexa D. Neckel
*Assistant Examiner* — Nicholas A. Smith
(74) *Attorney, Agent, or Firm* — Fitzpatrick, Cella, Harper & Scinto

(57) ABSTRACT

The present invention relates to a method and apparatus for partial etching or pattern etching using an electrolysis reaction, wherein, conventionally, there was the problem that an etching line could not be finely formed on a cell edge because of apparatus problems concerning alignment accuracy. The present invention provides a method and apparatus with which fine line etching is possible and which can form a line on a cell edge.

Provided is a an electrolytic etching method of a substrate which is formed having a subject etching layer on a surface, having the steps of providing a fixed gap from a substrate end surface which is external to an end surface of the substrate for placing a working part of a working electrode and passing current between the substrate and the working electrode.

3 Claims, 13 Drawing Sheets

ELECTROLYTIC ETCHING METHOD AND METHOD OF PRODUCING A SOLAR BATTERY

This application is a division of application Ser. No. 10/998,617, filed Nov. 30, 2004, now U.S. Pat. No. 7,691,241, which is incorporated herein by reference.

BACKGROUND OF THE INVENTION

1. Field of the Invention

The present invention relates to a method and apparatus for performing partial etching and pattern etching by an electrolytic reaction.

Specifically, the present invention relates to an improvement in the method and apparatus for removing a shorted portion and for device separation by etching a surface layer of a semiconductor device, such as a photovoltaic cell.

2. Related Background Art

Conventionally, thin-film etching has been carried out for device separation in a device having on a substrate a thin film of metal, a semiconductor, a transparent conductive film and the like, and for removing a short between thin films caused by mechanical stress at the cut surface. Examples of the above-mentioned device include various devices, for example, a photovoltaic cell, such as a solar battery, a sensor and the like, a light-emitting device (photoemitters), such as a photosensitive apparatus, an EL device and the like, and a transmissive or reflective device, such as a liquid crystal device, an electrochromic device and the like. In particular, for a solar battery fabricated through deposition onto a long metal substrate, it is necessary to divide the long substrate into small cells, and depending on the design it may be necessary to further electrically separate into small zone faces in the small cell interior. When divided up by cutting, the cut end surface becomes a shunt due to a short caused between the metal substrate and the transparent conductive film. Here, the word "shunt" encompasses not only a complete conductive state but also a state in which an insulation resistance value drops from slight conductance, irrespective of the amount. Even if it does not become a shunt, because the electrode at the cut surface is made bare, there is a possibility of a shunt forming as a result of stress during use. Thus, etching line formation is required as a preventative measure.

FIG. 12 is a schematic diagram showing a planar surface of an etched solar battery of a small cell that was cut from a long substrate. In FIG. 12, reference numeral 1201 denotes a substrate, reference numeral 1202 denotes an etching line inside the cell and reference numeral 1203 denotes a periphery etching line. As is clear from looking at FIG. 12, an etching line is a region that does not participate in generating electricity because the upper portion electrode is removed. Thus, from the viewpoint of effectively extracting power, it is preferable to form the lines as fine as possible. From the same perspective, it is also preferable to form the lines as far as possible on the cell edge.

FIG. 13A is a cross-sectional view of the line 13A-13A from FIG. 12, which explains the shunt state of a photovoltaic cell cross-section. In FIG. 13A, reference numeral 1201 denotes a substrate, reference numeral 1301 denotes a semiconductor layer, reference numeral 1302 denotes an upper electrode and reference numeral 1303 denotes a shunt portion. For a solar battery, the substrate 1201 consists of metal and is about 0.15 mm thick, a semiconductor layer 1301 is approximately several μm and an upper electrode 1302 is approximately several tens of nm. If the semiconductor layer 1301 is in a dark state, specific resistance is at least about $1 \times 10^{10}$·cm. Since the upper electrode is $1 \times 10^{3}$·cm, if an above-described shunt portion is not present, the space between the substrate and the upper electrode is effectively in an insulating state. If cutting was carried out by shirring or a press machine, the upper electrode 1302, which consists of a thin film, deforms as a result of being subjected to stress, thereby coming into direct contact with the metal substrate 1201, whereby a low-resistance shunt portion is formed. In other cases, even if the deformation does not cause a direct contact, a low-resistance shunt portion is formed as a result of the damage received from the stress. In this case, normal characteristics can be restored by using etching to remove the upper electrode 1302 of the shunt portion. That is, an etching line should be formed on the position of the shunt portion 1303. FIG. 13B shows the situation after the shunt portion 1303 of FIG. 13A has been etched. Reference numeral 1304 illustrates the condition in which the upper electrode 1302 has been removed by etching. FIG. 14 is a cross-sectional view along the line 14-14 in FIG. 12. In FIG. 14, reference numeral 1202 denotes an etching line, and the other reference numerals which are also indicated in FIG. 13A denote the same members as those in FIG. 13A.

FIG. 19 illustrates the IV properties when a shunt is present, and also when a shunt is not present, in a solar battery. When a shunt is present, as in FIG. 13A, the shunt resistance Rsh is, for example, about 1000Ω, wherein the IV curve is sloped. However, when a shunt has been removed by an etching line, as in FIG. 13B, the shunt resistance Rsh is, for example, about 1000 KΩ, wherein the IV curve is much better, being something close to a rectangle.

Examples of a conventional electrolytic etching method and apparatus for forming an etching line as discussed above include, for example, the suitable methods and apparatuses disclosed in Japanese Patent Application Laid-Open No. 9-115877 and Japanese Patent Application Laid-Open No. 2002-227000. The methods disclosed in these publications employ an electrode, which comprises a working electrode for dissolving a subject etching object by an electrochemical reaction and an auxiliary electrode for suppressing diffusion of the etching region resulting from the working electrode, wherein an insulating member is formed on the working electrode and/or the auxiliary electrode by a laminating or coating process.

In the above-described conventional art, the working electrode has the same shape as the etching pattern and is positioned facing the object being etching in an extreme proximity thereto, whereby a highly accurate etching pattern can be achieved.

FIG. 8 is a schematic cross-sectional view illustrating one example of a conventional electrolytic etching apparatus. In FIG. 8, reference numeral 801 denotes a working electrode, reference numeral 802 denotes an insulating member, reference numeral 803 denotes an auxiliary electrode, reference numeral 804 denotes the electrodes in entirety, reference numeral 805 denotes a substrate of the subject etching object, reference numeral 806 denotes an electrolyte, reference numeral 807 denotes an electrolysis bath and reference numeral 808 denotes an electrolysis power source.

The working electrode 801 is an electrode for dissolving the subject etching object by an electrochemical reaction. The auxiliary electrode 803 is used as a guard electrode, which absorbs a part of the electric field from the working electrode 801 to suppress diffusion of the etching region.

FIGS. 11A and 11B are schematic sketch views illustrating the electric field distribution of a conventional electrolytic etching apparatus. FIG. 11A is a view showing the electrode position in a central portion, and FIG. 11B is a view showing the electrode position in an end surface portion. FIGS. 11A and 11B show the situation where the working electrode 1101 has a plus electric potential, the substrate 1105 is a ground (electric potential=0) and the auxiliary electrode 1103 has been impressed with the same electric potential as the substrate 1105. As can be understood from FIGS. 11A and 11B, the electric field 1108 can be broadly divided up into an electric field heading from the working electrode 1101 to the upper electrode 1107 and an electric field heading from the working electrode 1101 to the auxiliary electrode 1108. The electric field headed from the working electrode to the upper electrode is involved as it is in the reaction with the upper electrode layer, wherein the spreading condition of that electric field has a close relationship with etching line width. The electric field heading from the working electrode to the auxiliary electrode is restricted in its electric field width due to its absorption of a part of the electric field originally heading from the working electrode to the upper electrode layer, thus acting to prevent the etching line width from unlimited spreading.

FIG. 9 illustrates a conventional electrolytic etching apparatus suitable for cases of etching the periphery of a rectangular substrate using the basic configuration of FIG. 8. FIG. 9 illustrates a configuration in which an etching electrode 904 mounted in a rectangle on a substrate upper portion is arranged having a narrow gap in the space between it and the substrate 905.

FIG. 10 illustrates an electrolytic etching apparatus, which further employs a rotating drum suitable for continuous processing in the apparatus shown in FIG. 9. In FIG. 10, reference numeral 1001 denotes an XY robot for substrate conveyance, reference numeral 1002 denotes a substrate absorption pad, reference numeral 1003 denotes a rotating drum and reference numeral 1009 denotes an air cylinder for etching electrode drive.

In this apparatus, the substrate is mounted on the rotating drum 1003 and is immersed in an electrolyte 1006 by rotating. After this, the substrate is moved by the air cylinder 1009 until the electrode 1004 strikes a strike pin (not shown), whereby a fixed space is secured from the substrate 1005. This space is usually designed to be extremely narrow, at about 0.1 mm to 1 mm, which prevents the electric field from leaking, whereby a fine etching line can be formed. After the electrode position has been decided, current is passed from the power source 1008 to carry out electrolytic etching.

As described above, to effectively extract the power of a solar battery, it is important that the etching lines be as fine as possible and be formed as far as possible on a cell edge so that the effective region can be as broad as possible.

However, in a conventional electrolytic etching method, it was impossible to form a fine line on a cell edge because of alignment problems with the electrode position accuracy and substrate position accuracy.

That is, if the alignment accuracy of the electrode position and the substrate position is, for example, 0.2 mm, unless either the etching line is widened by 0.2 mm more than the originally required width, or the electrode is positioned about 0.2 mm inside the originally required position, the etching pattern may not form at all on the substrate edge. In a region in which an etching pattern is not formed, because shunt portions in the cell remain, cell output worsens.

Trying to solve this problem by improving the alignment accuracy would require a large-scale mechanical apparatus, which makes implementation extremely difficult.

Because of the above-described points, forming a fine etching line on a cell edge was difficult, which was a limitation on effective extraction of power.

SUMMARY OF THE INVENTION

The present inventors have found that, in order to solve the above-described problems, performing the following matters is preferable for an electrolytic etching method and apparatus, which can form etching lines on a cell edge in fine lines to effectively extract power.

That is, the present invention is an electrolytic etching method of a substrate having a subject etching layer on its surface, comprising the steps of: providing a fixed gap from a substrate end surface, external from an end surface of the substrate, to place a working part of a working electrode; and passing current between the substrate and the working electrode.

The present invention is also an electrolytic etching method, wherein the position of the above-described working part is above the subject etching layer.

Further, it is preferable that the gap is at least 0.25 mm and not more than 50 mm.

It is preferable that an auxiliary electrode is provided via an insulating member on at least one surface of the working electrode.

It is preferable that the electric potential of the auxiliary electrode is a substantively different electric potential from the electric potential of the working electrode.

The electrolytic etching method according to the present invention can be preferably employed when etching an upper electrode which is formed on an outermost surface of a photovoltaic cell comprising a semiconductor layer deposited on the substrate and an upper electrode layer.

The present invention is also an electrolytic etching apparatus of a substrate having a subject etching layer on its surface, comprising means for supporting the substrate and a working electrode having a working part positioned having a fixed gap from a substrate end surface which is external from an end surface of the supported substrate.

The present invention is also an apparatus in which the position of the above working part is above a subject etching layer.

It is preferable that the above gap is at least 0.25 mm and not more than 50 mm.

It is preferable that an auxiliary electrode is provided via an insulating member on at least one surface of the working electrode.

It is preferable that the electric potential of the auxiliary electrode is a substantively different electric potential from the electric potential of the working electrode.

In addition, the electrolytic etching apparatus according to the present invention can be preferably employed when etching an upper electrode formed on an outermost surface of a photovoltaic cell which comprises a semiconductor layer deposited on the substrate and an upper electrode layer.

In accordance with the electrolytic etching method and apparatus according to the present invention, solar battery power can be effectively extracted by forming a fine etching line on a cell edge, without having to worry about the alignment accuracy between a substrate and an electrode.

DESCRIPTION OF THE PREFERRED EMBODIMENTS

Embodiments of the invention will now be explained with reference to the drawings.

Figure 1:
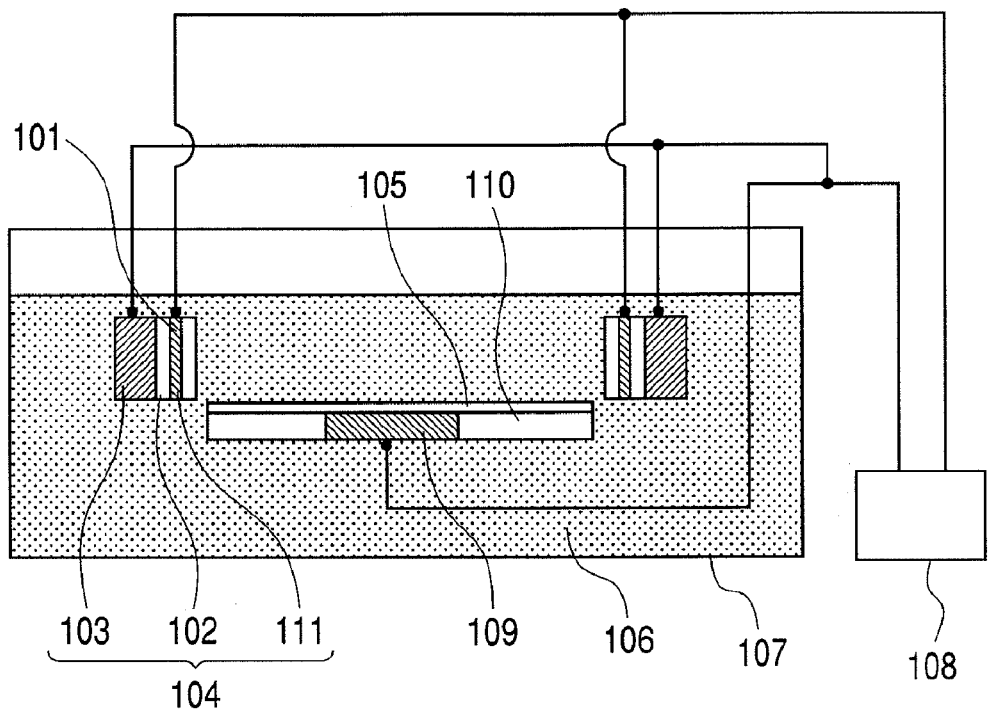
FIG. 1 is a schematic cross-section diagram which illustrates a first preferable configuration of an electrolytic etching apparatus according to the present invention.

FIG. 1 is a schematic cross-section diagram which illustrates a preferable embodiment of the electrolytic etching apparatus according to the present invention. In FIG. 1, reference numeral 101 denotes a working electrode, reference numeral 111 denotes a working part, reference numeral 102 denotes an insulating member, reference numeral 103 denotes an auxiliary electrode, reference numeral 104 denotes the electrode in its entirety, reference numeral 105 denotes a substrate on which a subject etching layer is deposited, reference numeral 106 denotes an electrolyte, reference numeral 107 denotes an electrolytic bath, reference numeral 108 denotes a power source for electrolysis, reference numeral 109 denotes a support electrode and reference numeral 110 a support member.

The working electrode 101 is an electrode for dissolving the subject etching layer by electrochemical reaction. The auxiliary electrode 103 is a guard electrode which absorbs part of the electric field for suppressing diffusion of the etching region from the working part 111.

In the electrolysis method employing the electrolytic etching apparatus according to the present invention, the substrate 105 is mounted on the support member 110 and conductance is provided to the substrate back surface by the support electrode 109. The working electrode 101 is arranged with a fixed gap provided on the exterior of the end surface of the substrate 105, wherein current is passed from the power source 108 through the gap between the working electrode 101 and the support electrode 109.

Figure 15:
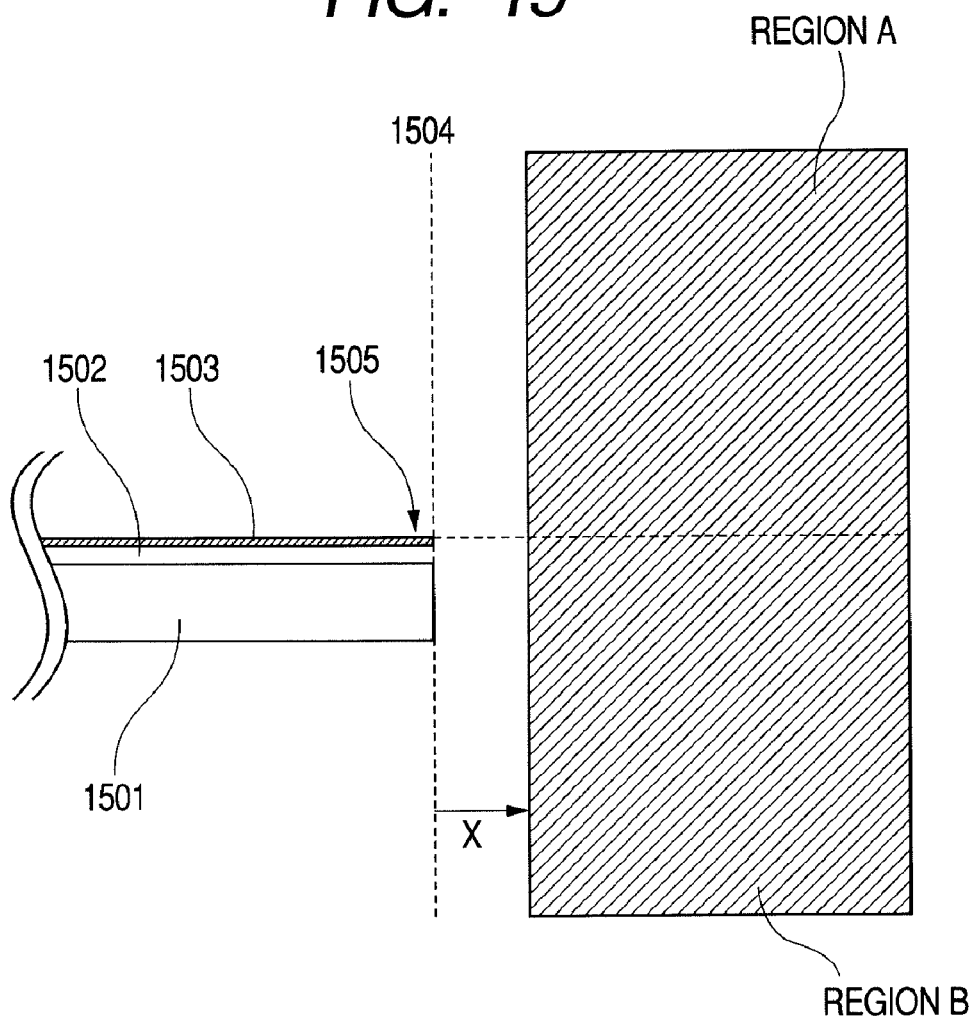
FIG. 15 is a sketch diagram illustrating the specific positional relationship between a working electrode and the substrate according to the present invention.

FIG. 15 illustrates the specific positional relationship between the working electrode and the substrate according to the present invention. In FIG. 15 reference numeral 1501 denotes a substrate, reference numeral 1502 denotes a semiconductor layer and reference numeral 1503 denotes an upper electrode, wherein the dotted line shown by reference numeral 1504 illustrates the substrate end surface. In FIG. 15 the reference character X illustrates the gap from the substrate end surface.

In the present invention, the working part of the working electrode is characterized by being external to the substrate end surface, and being provided with a fixed gap from the substrate end surface. That is, in FIG. 15 the working part of the working electrode must be arranged in the slanted line region (region A+region B) separated from gap X and from the substrate end surface 1504. When the working electrode is arranged externally to the substrate end surface 1504, the 1505 portion in FIG. 15 in the upper electrode 1503 is at its closest distance to the working part, so that the 1505 portion has an maximum number of electric field lines, whereby appropriately choosing the etching voltage and etching time allows for formation of thin etching lines on the cell edge. In addition, because the working electrode is arranged externally to the substrate end surface, even if the substrate position and the working electrode are slightly out of alignment, there is no change in the electric field lines concentrating at the 1505 portion. Therefore, strict alignment precision is not particularly required, wherein it is possible to form fine etching lines only on the cell edge.

In particular, when the working part is arranged in the region A part above the upper electrode 1503, which is the subject etching layer, because the electric field lines can be more efficiently concentrated at the 1505 portion than region B, effects such as the shortening of the etching processing time can be achieved, which is extremely preferable from a productivity standpoint.

Regarding the gap expressed as "X" in FIG. 15, while making the gap to be small by putting the working part as close as possible to the substrate end surface is preferable in terms of etching efficiency, if the working part is put too close, air bubbles accumulate between the substrate end surface and the working electrode, whereby other problems occur such as etching being hindered. Alternatively, if the working electrode is arranged in the air bubbles' exit route, air bubbles collide with the working electrode and accumulate, which is similarly an etching-inhibiting factor. On the other hand, when the working part and the substrate edge part are too far away, the problem arises that etching becomes inefficient. In view of these points, the gap size is preferably at least 0.25 mm and not more than 50 mm.

Figure 6:
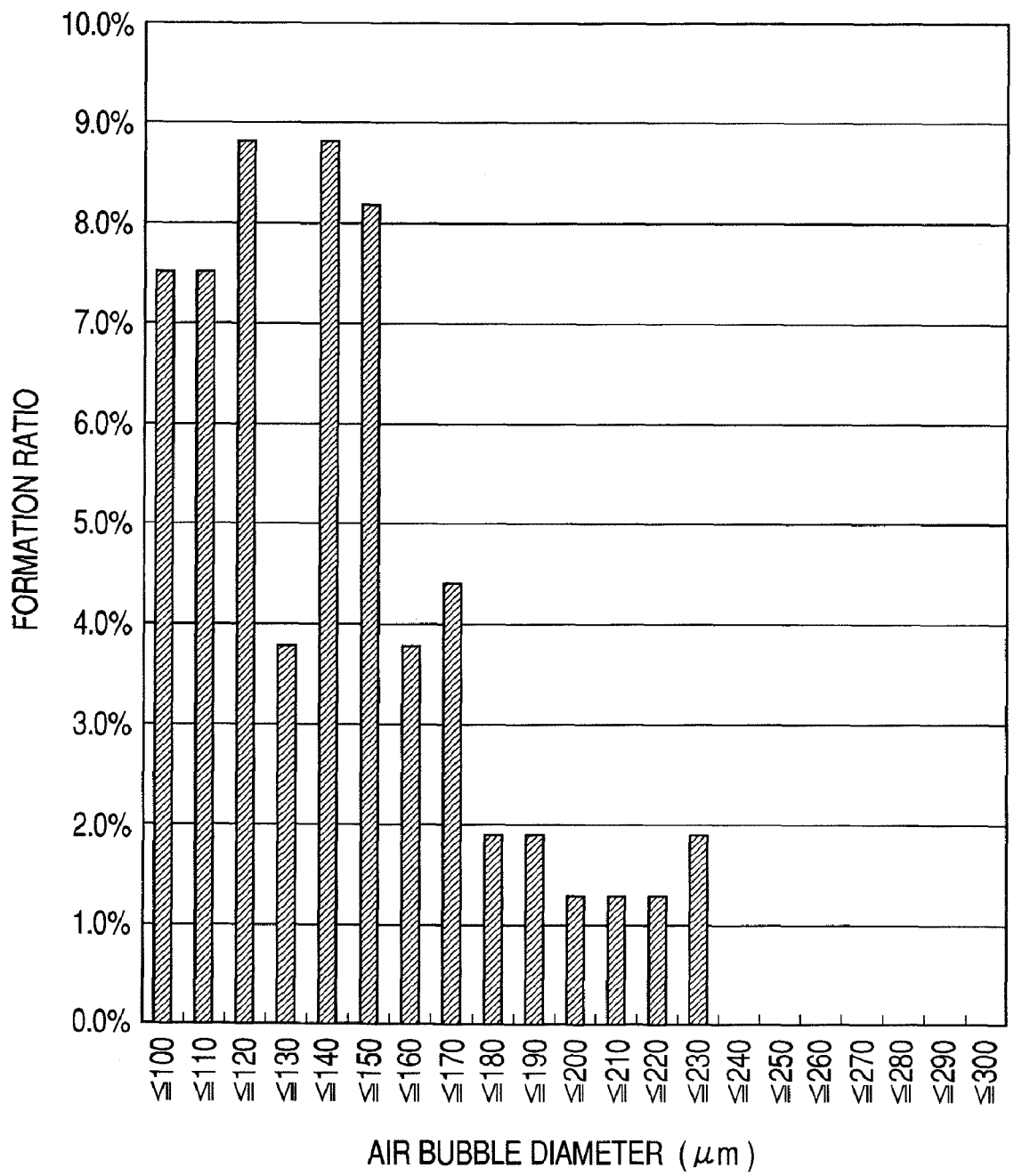
FIG. 6 is a chart illustrating the diameter distribution of air bubbles.

FIG. 6 shows the diameter distribution of air bubbles that were at least 100 μm from among the air bubbles that actually formed at the substrate side. The number of air bubbles dramatically decreases at a diameter of 160 μm or more, and is zero at a diameter of 250 μm or more. Thus, it was learned that if the gap between the substrate end surface and the working electrode is made less than 250 µm, the possibility that air bubbles will accumulate increases.

Regarding the state of the substrate during processing, from the objective of forming a fine line on the cell edge, whether the apparatus is horizontal as in FIG. 1, or vertical, is not particularly a problem. However, if the above-described air bubbles problem is also taken into consideration, it is preferable to have a horizontal apparatus or roughly horizontal apparatus which can reliably ensure the air bubbles' exit route.

Figure 7A:
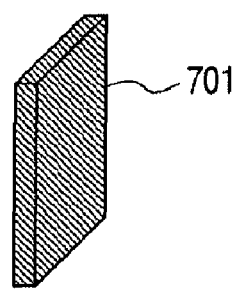
FIGS. 7A, 7B and 7C are schematic cross-section diagrams illustrating the electrode configuration preferably used in the present invention.
Figure 7B:
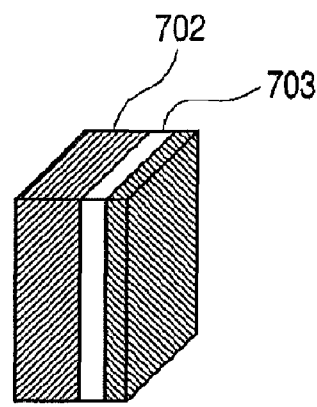
Figure 7C:
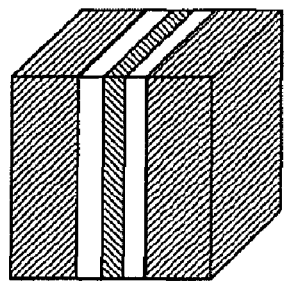

FIGS. 7A, 7B and 7C are schematic cross-section diagrams of the electrode preferably used in the electrolytic etching apparatus according to the present invention. FIG. 7A shows a configuration of a working electrode 701 only, FIG. 7B shows a configuration in which an insulating member 702 and an auxiliary electrode 703 are laminated and FIG. 7C shows a configuration in which an insulating member 702 and an auxiliary electrode 703 are laminated on both sides of a working electrode 701.

The lower surface in all of these figures is the electrode end surface (working part). The end surface of the working electrode 701, insulating member 702 and auxiliary electrode 703 are generally arranged in line in the same horizontal plane, wherein the lined up end surfaces are preferably made to function as the etching electrode. However, they are not particularly restricted to being in the same horizontal plane, so that there are no particular problems in, for example, setting the working part to be more sharp for finer etching, or arranging irregular shapes, curves and projections to hinder air bubbles from accumulating.

For each of the configurations, in order to make only the lower surface function as the etching electrode, regions other than the lower surface of the working electrode may be insulation treated. In addition, the electrode end surface may be arranged laterally to the subject etching layer. Compared to the configuration shown in FIG. 7A, electric filed leakage can be preferably prevented by having a configuration in which the insulating member 702 and auxiliary electrode 703 sandwich the working electrode 701 as shown in FIGS. 7B and 7C. Each of the electrodes can be selected for use as needed.

Although the width of the working electrode 701 end surface is designed according to the required etching pattern, when forming an etching line on the upper electrode of a solar battery, for example, shunt prevention and device separation are possible at a width of about 0.1 mm to 2 mm. The width and depth of the etching line is determined depending on various parameters such as the widths of the working electrode and auxiliary electrode, electrolysis voltage and inter-electrode distance, and may be formed as required from 0.1 mm to about several tens of mm. The length of the working electrode can also be set according to the etching line. For etching of a 240 mm×350 mm rectangular solar cell periphery, two 240 mm length working electrodes and two 350 mm length working electrodes could be readied, or a 240 mm×350 mm rectangular frame type electrode could also be readied. The thickness of the insulating member 703 can be any thickness where insulation between electrodes is possible, and may be selected to a required thickness from about 0.1 mm to about 2 mm. The thinner the thickness, the more the electric field is confined to a narrow region, whereby thinner lines are possible.

An electroconductive material such as a metal ingredient can be used for the material of the working electrode 701 and the auxiliary electrode 703. Specific examples that can be used include platinum, carbon, gold, stainless steel, nickel, copper, lead or an alloy thereof. In particular, platinum, gold and carbon are chemically stable, do not dissolve very much into even an acidic solution such as an electrolyte and are easily worked into a desired pattern, and are thus preferably used.

A material that does not absorb the electrolyte or deform as a result thereof is preferably used for the insulating member 702. In terms of durability, a processed epoxy resin, phenol resin, silicon resin and the like can be preferably used. Further, the insulating member 702 does not have to be a complete insulator, and by using an insulating member which comprises a semi-insulator having an electrical conductivity of $\frac{1}{10}$ or less, such as an electrolyte, for example, subtle patterning may be controlled. It is preferable to fabricate the working electrode 701, the insulating member 702 and the auxiliary electrode 703 by sticking them close together to prevent moisture from entering and them from electrically conducting with each other. To achieve this, for the insulating member 702, a method for hardening is preferably employed in which a material consisting of an epoxy prepreg is used and subjected to thermal pressure bonding.

Although it is an object of the present invention to remove a shunt state between the upper electrode and the substrate, an etching line that can be visually observed is not required, wherein it is sufficient to etch the end surface of the upper electrode that is in a shunt state.

Next, the following simulation was carried out on the differences in current density flowing through the subject etching layer depending on electrode position.

Figure 17:
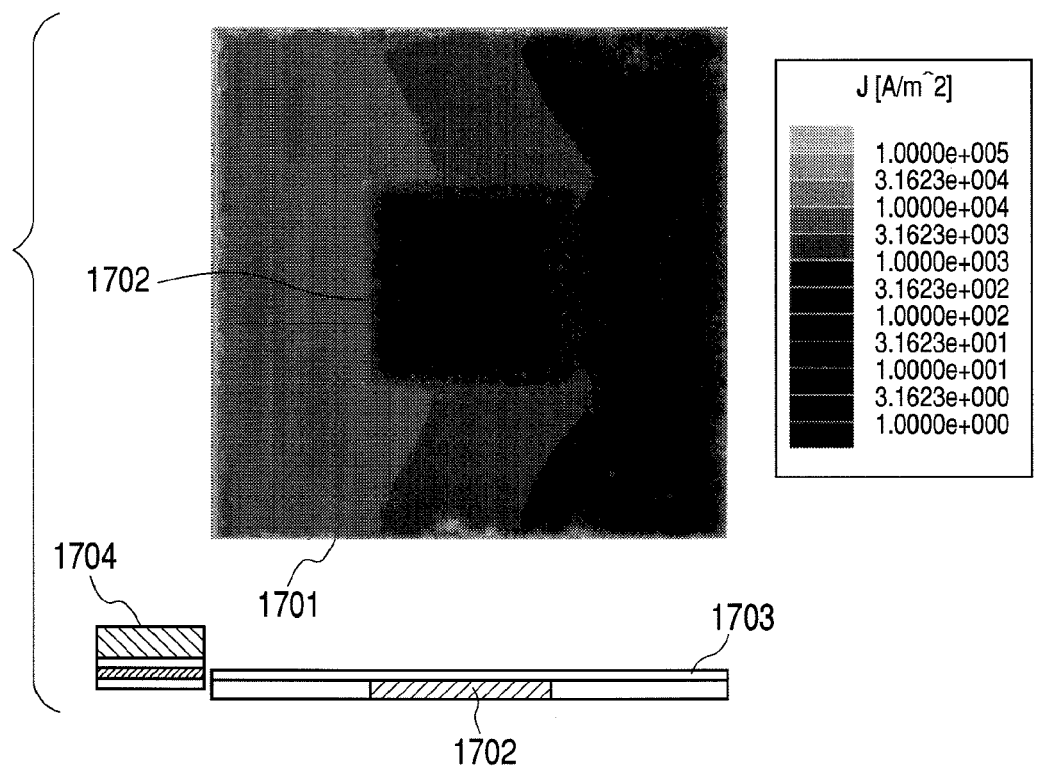
FIG. 17 is a diagram which illustrates current density distribution when the electrolytic etching apparatus according to the present invention is used.

FIG. 17 shows the results of a simulation carried out into current distribution using electromagnetic simulation software according to a finite element method when etching was performed using the electrolytic etching apparatus according to the present invention. As is noted in FIG. 17, the simulation model used a configuration in which the apparatus, which was arranged so that the electrode end surface faced the substrate end surface as in FIG. 2, was immersed in an electrolyte on the left side of the substrate periphery. FIG. 17 is a diagram which includes both a cross-sectional schematic diagram of the electrode configuration according to the present invention and the corresponding simulation results. The diagram showing the simulation results is a planar view of the substrate 1701 as seen from above, wherein an electrode 1704 is arranged on the left edge and the rectangular portion 1702 in the vicinity of the center corresponds with a current extracting plate on the substrate back surface side. The shading shows the electrolysis current density distribution on the solar battery upper electrode 1703, wherein the lighter the coloring is the greater is the current density. As the simulation conditions, 1 V was impressed on the working electrode of the electrode 1704, and the auxiliary electrode and current extracting plate 1702 were made to be grounds (electric potential=0 V). The simulation was carried out into the current density ($J/m^2$) on the upper electrode 1703 by setting the path in which current was flowing to be from the working electrode to the current extracting plate 1702 via the electrolyte. As can be understood from FIG. 17, because the electrode 1704 is arranged on the left edge, current density is high on the left and decreases progressing towards the right.

Figure 8:
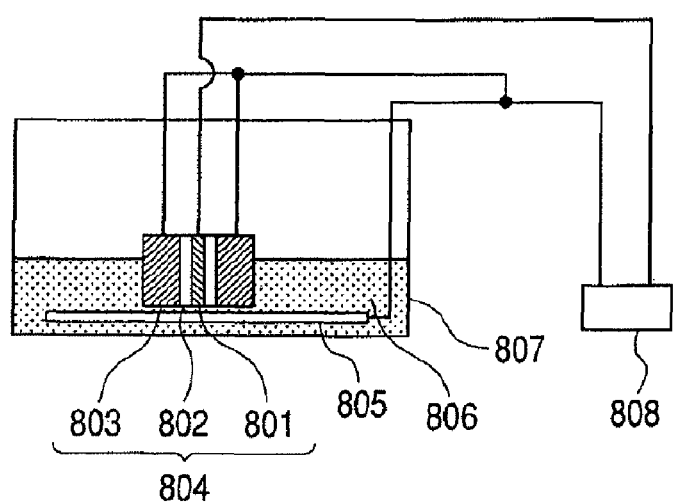
FIG. 8 is a diagram illustrating a schematic cross-section of a conventional electrolytic etching configuration.
Figure 18:
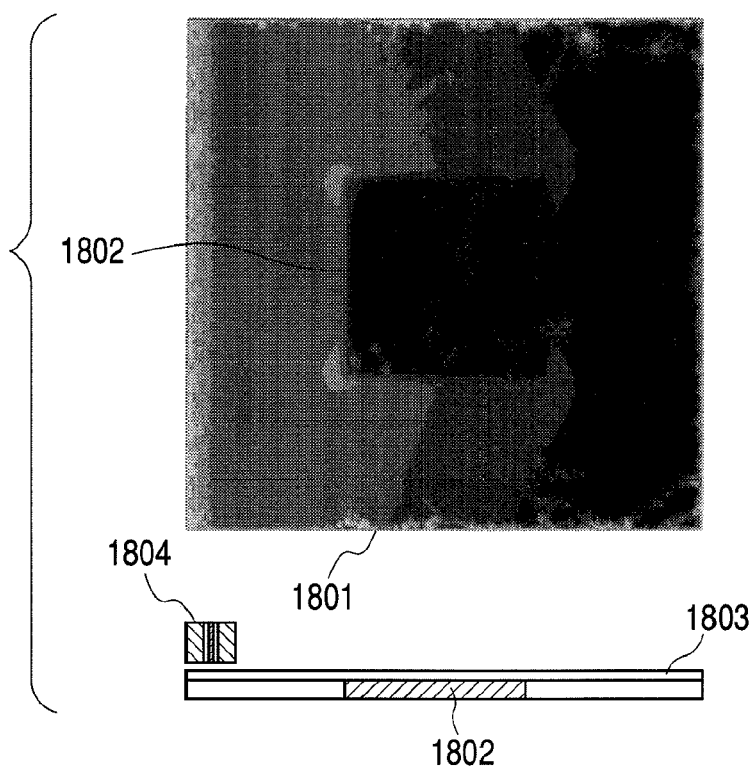
FIG. 18 is a diagram which illustrates current density distribution when a conventional electrolytic etching apparatus is used.
Figure 19:
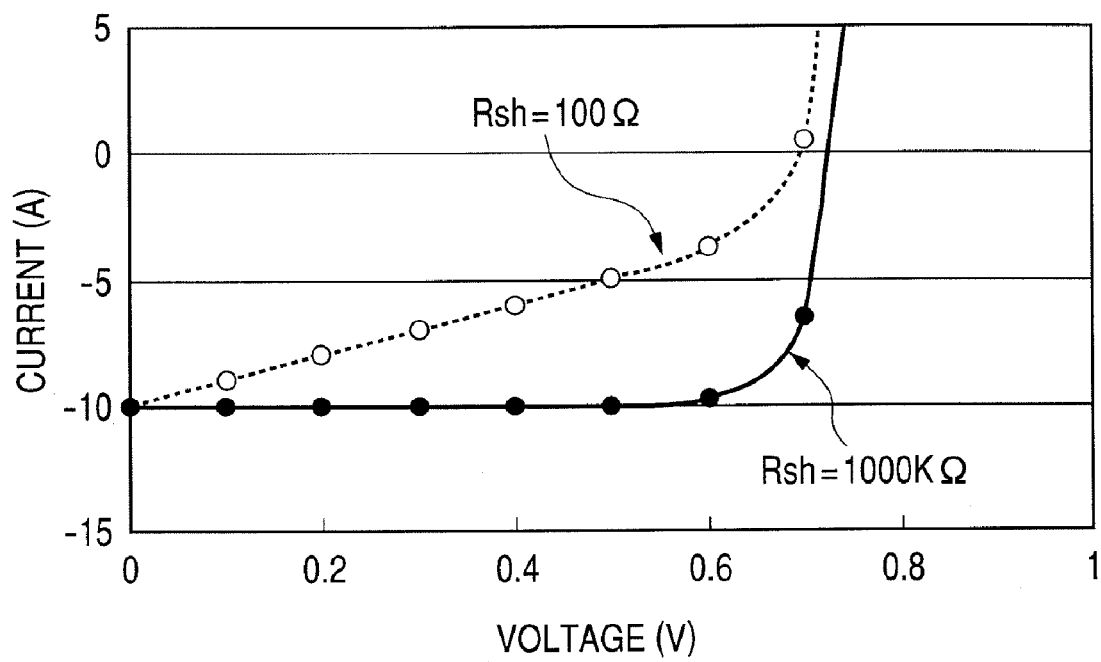
FIG. 19 is a diagram illustrating solar battery properties before and after etching.

For comparison, FIG. 18 shows a simulation wherein an electrode 1804 was arranged on the left edge of a substrate 1801 using the conventional electrolytic etching apparatus shown in FIG. 8. In FIG. 18, reference numeral 1802 denotes a rectangular portion and reference numeral 1803 denotes an upper electrode. As can be understood from FIG. 18, compared with the present invention, the current density is broadly spread out on the right side. Thus, as understood from FIGS. 17 and 18, using the electrolytic etching apparatus according to the present invention allows the electric field spread in the subject etching layer to be made smaller and etching width to be narrower.

Either a constant current process or a constant voltage process can be employed in the electrolytic etching apparatus according to the present invention, wherein the process is selected as appropriate. For the electrode in FIGS. 7B and 7C, although the electric potential of the substrate back surface and the electric potential of the auxiliary electrode was made a ground (potential=0V) with respect to that of the working electrode in both the constant current process and constant voltage process, the electric potential of the auxiliary electrode can also be independently controlled. In such a case, by making the electric potential lower than that of the working electrode, or making the polarity opposite, electric field leakage can be prevented, making excellent etching possible. In addition by controlling the amperage and electrolysis time, a sharper etching line can be achieved. For example, if direct current is used, by setting the current value, control of the etching line can be achieved so that thickness increases in proportion to time. If pulsed current is used, by controlling the impression frequency of the pulse, the etching line can be controlled so that thickness increases in a similar fashion.

Figure 20:
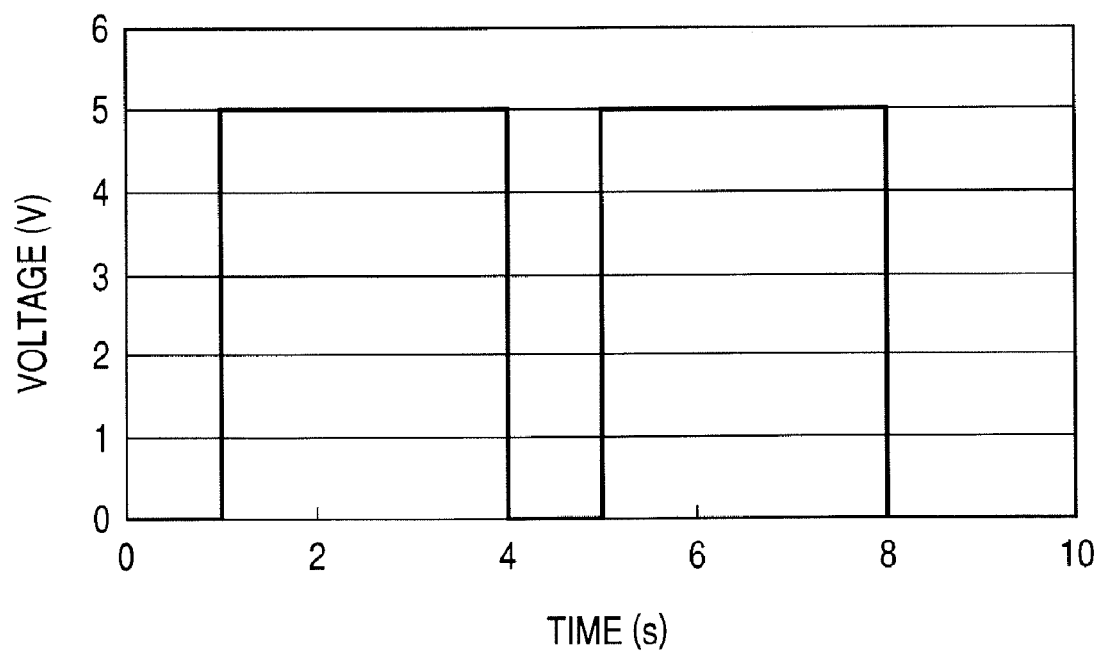
FIG. 20 is a diagram illustrating a voltage impression pattern preferably used in the electrolytic etching apparatus according to the present invention.

FIG. 20 is a diagram which schematically illustrates one example of applied voltage. FIG. 20 shows the electric potential time change of the working electrode with respect to the substrate back surface. Applied electric potential, applied time, rest time and applied frequency can be chosen appropriately as required. The auxiliary electrode may have the same electric potential as the substrate back surface, while in certain cases it may have a minus electric potential.

The power source used in electrolytic etching apparatus according to the present invention is compatible with constant current process or constant voltage process, wherein the control employs a well-known direct current constant current power source or a direct current constant voltage power source. While power is usually carried between an working electrode and a substrate back surface, for electrodes such as those shown in FIGS. 7B and 7C, power may also be carried to the auxiliary electrode. If the auxiliary electrode and the substrate back surface are made to have the same electric potential by simply causing them to short circuit, a dedicated power source for a separate auxiliary electrode is not necessary. The applied voltage power-on pattern may be adjusted as appropriate according to requirements, although the power source should be able to handle preferable methods such as once-only power-on, repeated power-on from pulses and the like.

The electrolyte 106 acts as a medium for producing an electrochemical reaction, and is electroconductive. Examples of the electrolyte 106 include an acid or base which is itself a liquid, or an electrolyte solution such as an aqueous solution of an acid or base, for example, or aqueous solution of a salt thereof. Preferably used is a Lewis acid, a Lewis base or a solution thereof. Specific examples include an aqueous solution of sodium chloride, potassium chloride, aluminum chloride, zinc chloride, tin chloride, ferric chloride, sodium nitrate and potassium nitrate; hydrochloric acid, nitric acid, sulfuric acid or solution thereof diluted with water, and the like used as appropriate according to the material of the subject etching part of the subject etching object 102.

Since an acid or the like is used for the electrolyte 106, a bath that is made from a low-corrosive material is preferably used as the electrolytic etching bath 107. Specific examples of the material for the electrolytic etching bath 107 include vinyl chloride resin or acrylic resin, of which preferably used is a material that is corrosion resistant, does not form rust, is light weight and easy to work. A thermostat may also be provided to control the temperature of the electrolyte as needed.

Substrates comprising a transparent conductive film or metal layer can be cited as a preferable etching object for use in the electrolytic etching method and apparatus according to the present invention. Such an etching object can be applied to the production of a variety of devices and apparatuses, specific examples including a photovoltaic device such as a solar battery, a sensor and the like, a light-emitting device (photo-emitter) such as a photosensitive apparatus, an EL device and the like, a transmissive or reflective device such as a liquid crystal device and an electrochromic device and the like. In particular, the etching object is preferably applied to a thin-film and large surface area solar battery.

The above-described solar battery typically has a configuration in which, for example, a thin film of amorphous silicon or microcrystalline silicon is deposited onto a stainless steel substrate, and a transparent electrode consisting of ITO or similar is deposited as an upper electrode. The above-described solar battery can also be divided up into an active areas (power generating area) and a non-active area (non power generating areas). Such a solar battery can easily be divided into active areas and non-active areas by removing only the upper electrode using etching, for which purpose electrolytic etching is an effective means. The etching subject on the solar battery is the transparent electrode, consisting of ITO or similar, which has a thickness of several tens of nm. For such a thin film, etching is possible in a short time of just a few seconds using electrolysis.

Figure 2:
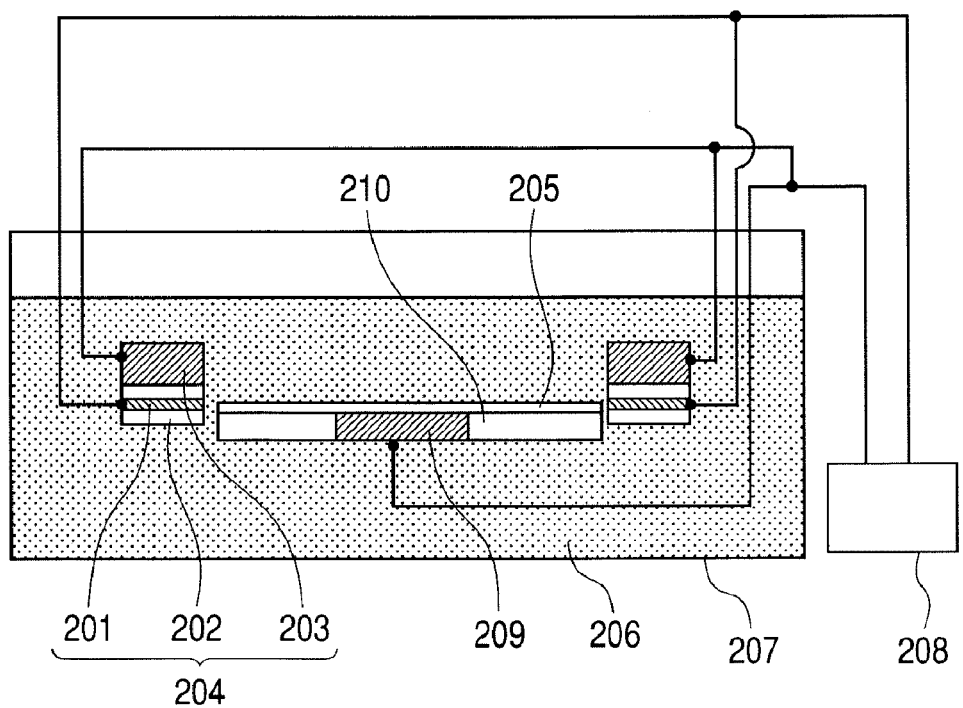
FIG. 2 is a schematic cross-section diagram which illustrates a second preferable configuration of an electrolytic etching apparatus according to the present invention.
Figure 3:
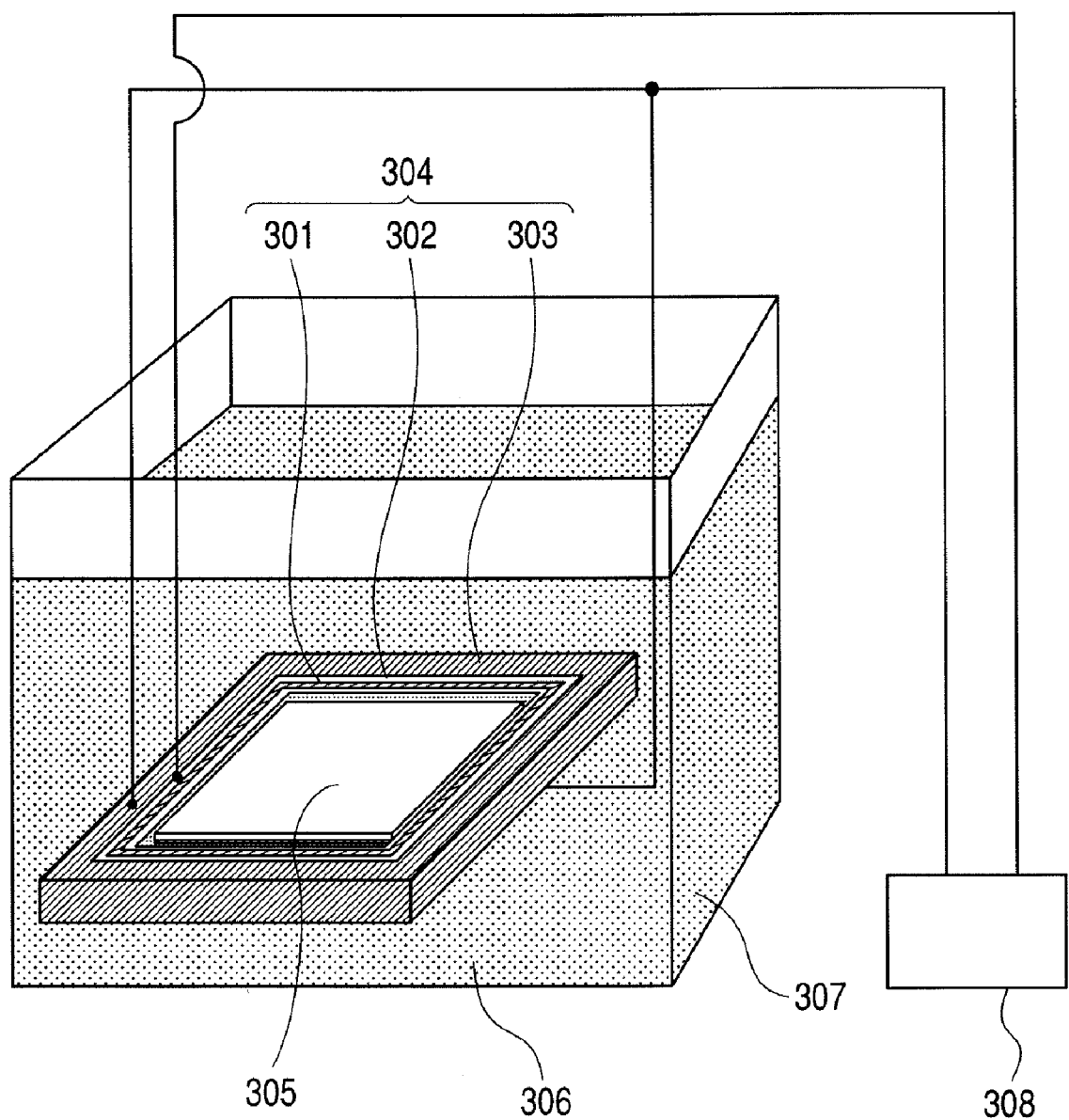
FIG. 3 is a diagram which illustrates FIG. 1 three-dimensionally.

FIG. 2 illustrates a second example of a preferable embodiment of an etching apparatus according to the present invention. In FIG. 2, an electrode main body 204 is arranged in an orientation wherein the electrode is facing the substrate cross-section externally to the periphery of the substrate 205. In FIG. 2, reference numeral 201 denotes a working electrode, reference numeral 202 denotes an insulating member, reference numeral 203 denotes an auxiliary electrode, reference numeral 204 denotes the electrode in its entirety, reference numeral 205 denotes a substrate of the subject etching object, reference numeral 206 denotes an electrolyte, reference numeral 207 denotes an electrolysis bath, reference numeral 208 denotes an electrolysis power source, reference numeral 209 denotes a support electrode and reference numeral denotes 210 a support member FIG. 3 illustrates an example applied to a rectangular substrate of a preferable first embodiment for carrying out the present invention. In FIG. 3, the subject etching substrate 305 is a rectangular flat sheet, and the electrode 304, which is an electrode configured as in FIG. 7C, is arranged on the periphery of the substrate 305. The electrode 304 is configured so that a working electrode 301, an insulating member 302 and an auxiliary electrode 303 are laminated from the bottom in that order. With this configuration, the 4 sides of the substrate 305 can be etched together. In FIG. 3, reference numeral 301 denotes a working electrode, reference numeral 302 denotes an insulating member, reference numeral 303 denotes an auxiliary electrode, reference numeral 304 denotes the electrode in its entirety, reference numeral 305 denotes a substrate of the subject etching object, reference numeral 306 denotes an electrolyte, reference numeral 307 denotes an electrolysis bath and reference numeral 308 denotes an electrolysis power source.

Figure 4:
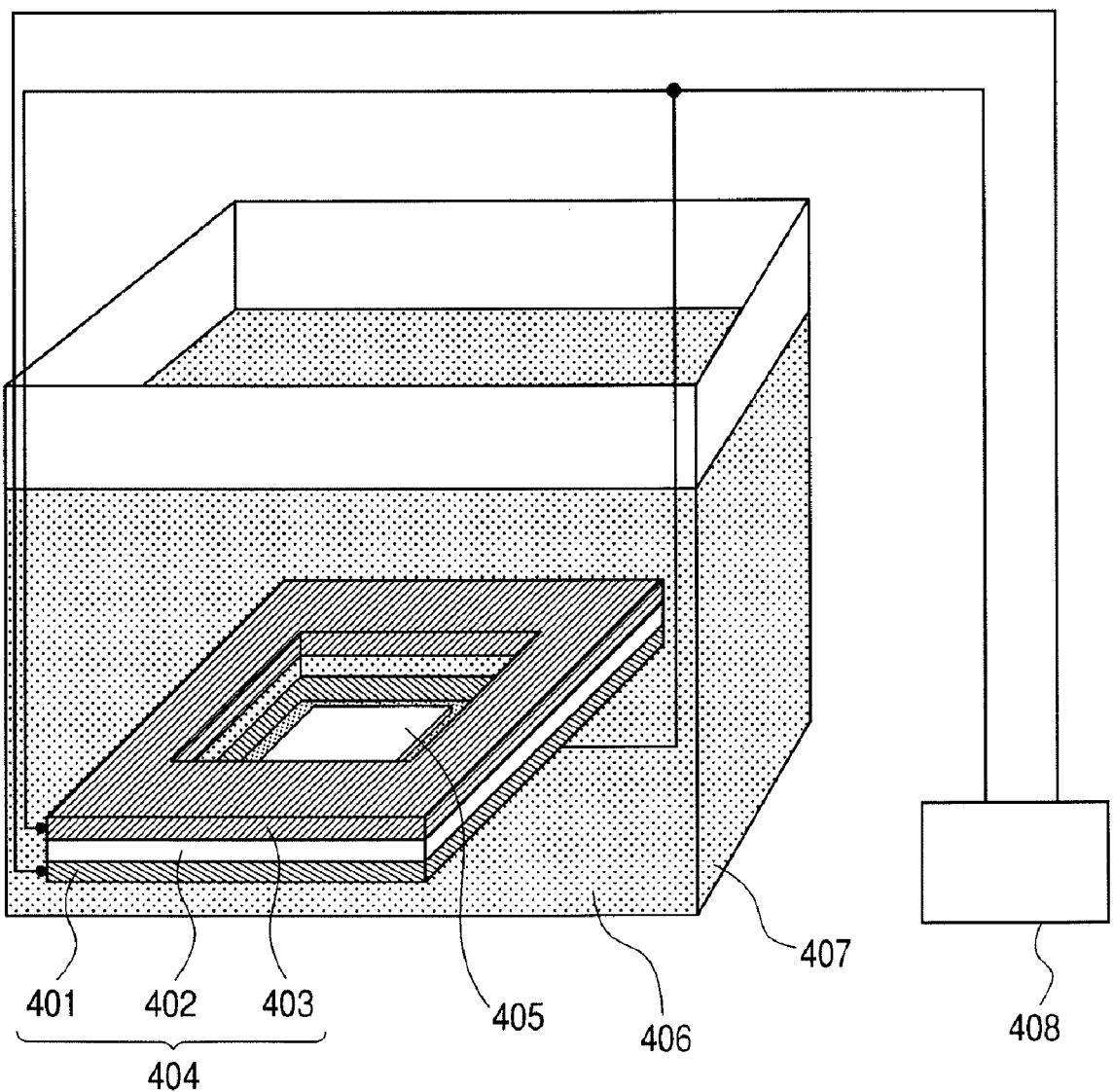
FIG. 4 is a diagram which illustrates FIG. 2 three-dimensionally.

While FIG. 4 generally has the same configuration as FIG. 3, it employs the configuration of FIG. 7B as its electrode. In this case, the auxiliary electrode 403 is only arranged on an upper portion at the periphery of the substrate edge, although a sandwich structure in which an auxiliary electrode is arranged on the opposite side with a working electrode in the middle may also be employed. In FIG. 4, reference numeral 401 denotes a working electrode, reference numeral 402 denotes an insulating member, reference numeral 403 denotes an auxiliary electrode, reference numeral 404 denotes the electrode in its entirety, reference numeral 405 denotes a substrate of the subject etching object, reference numeral 406 denotes an electrolyte, reference numeral 407 denotes an electrolysis bath and reference numeral 408 denotes an electrolysis power source.

Figure 5:
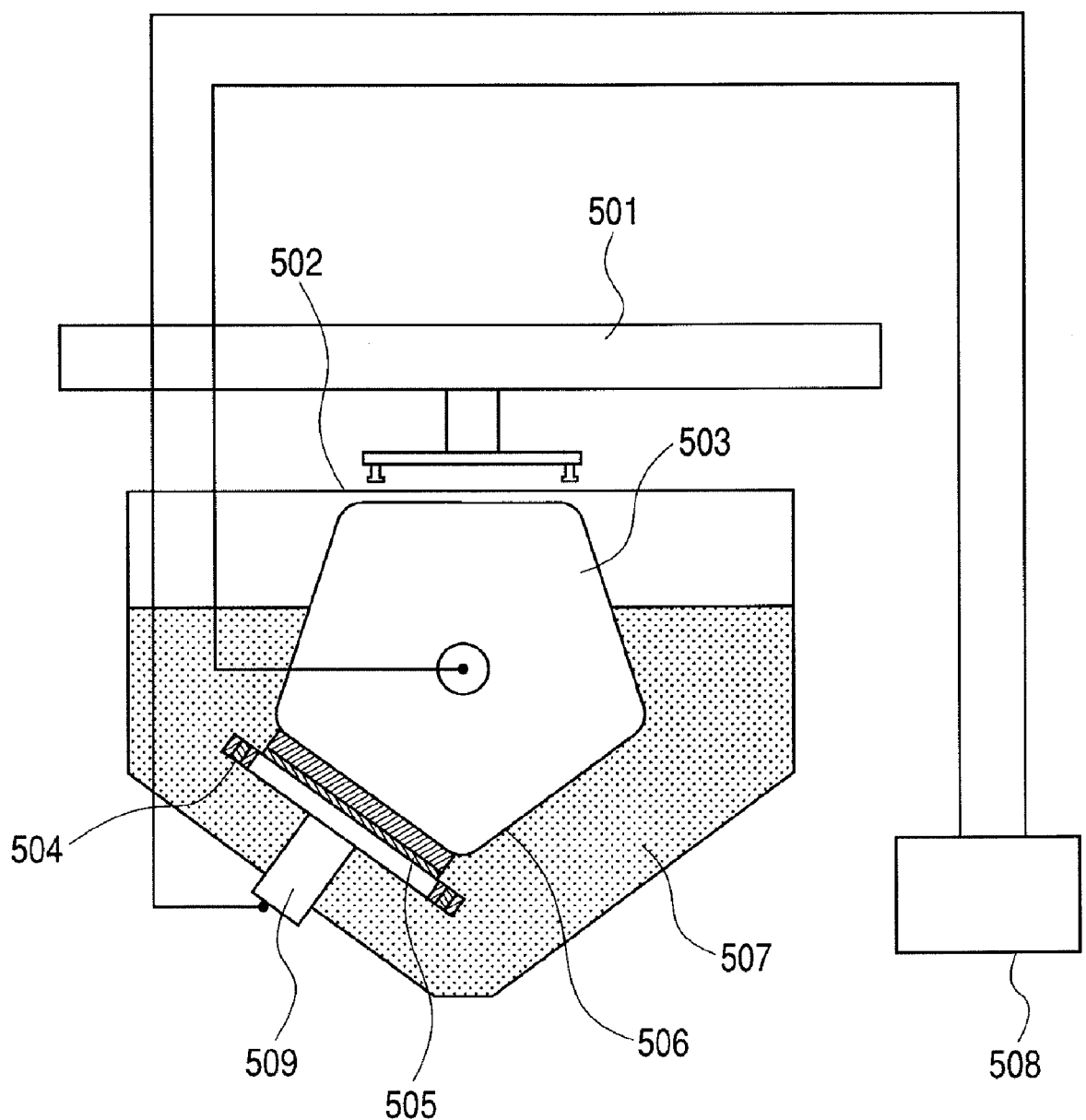
FIG. 5 illustrates an electrolytic etching apparatus wherein the present invention is set to be a continuous processing type.
Figure 10:
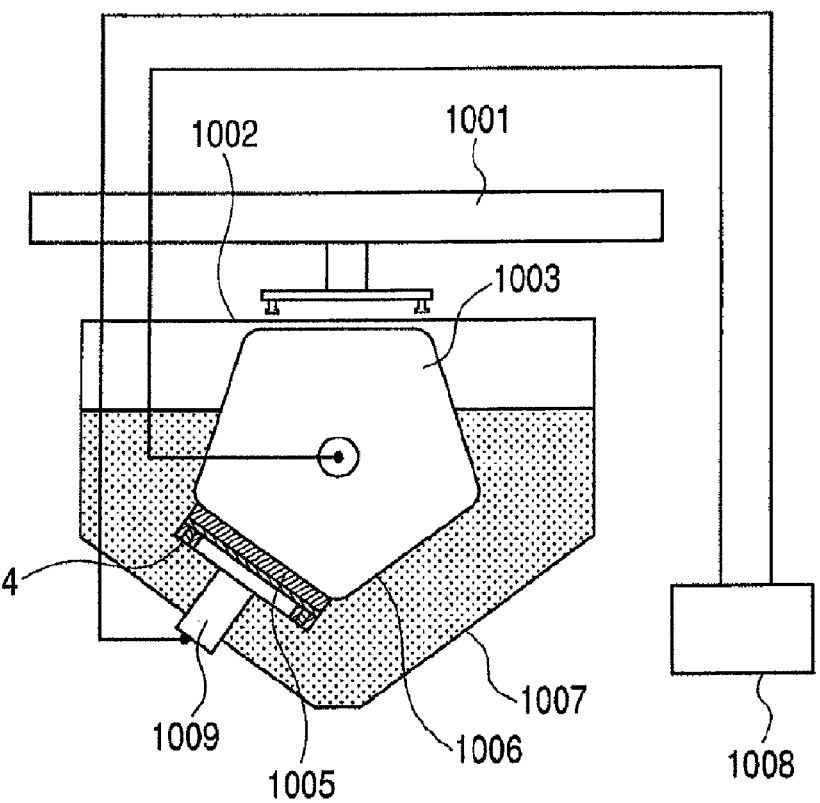
FIG. 10. illustrates a conventional continuous processing type electrolytic etching apparatus.
Figure 11A:
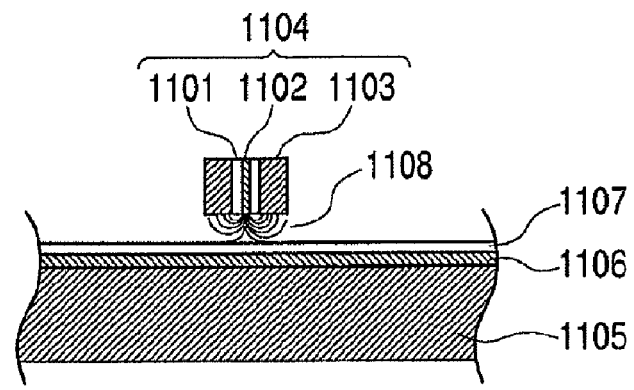
FIGS. 11A and 11B are diagrams illustrating schematic cross-sections which show the electric field distribution of a conventional electrolytic etching apparatus.
Figure 11B:
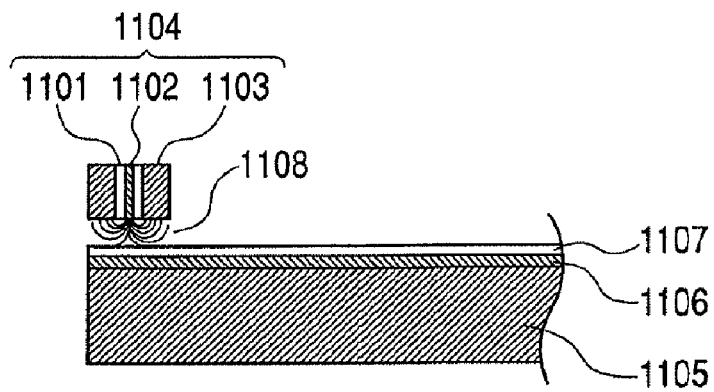
Figure 12:
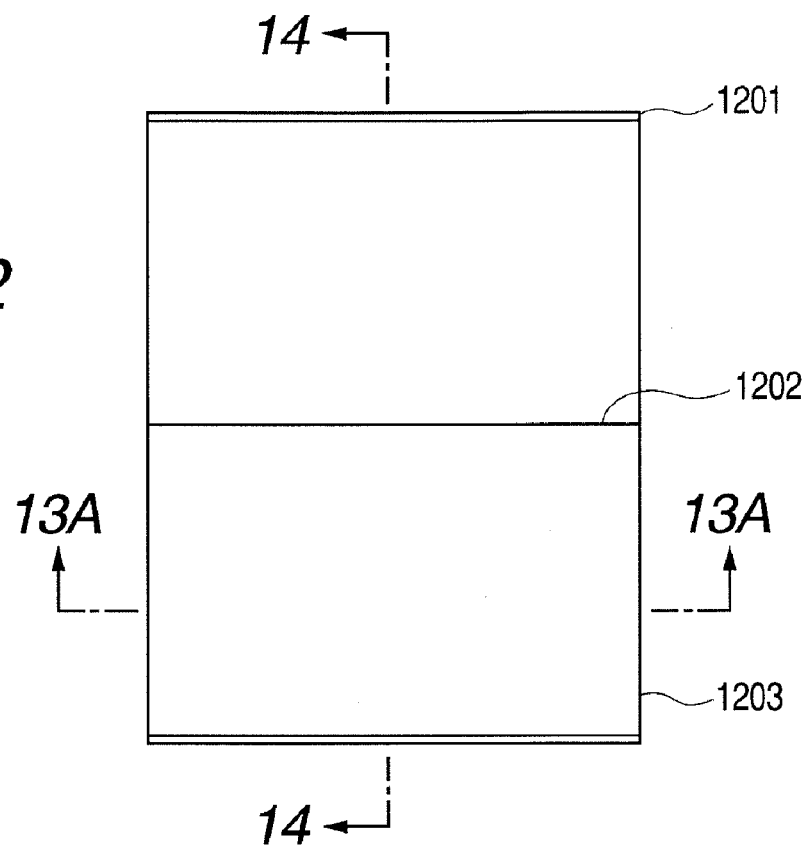
FIG. 12 is a schematic diagram illustrating a planar surface of an etched solar battery.
Figure 13A:
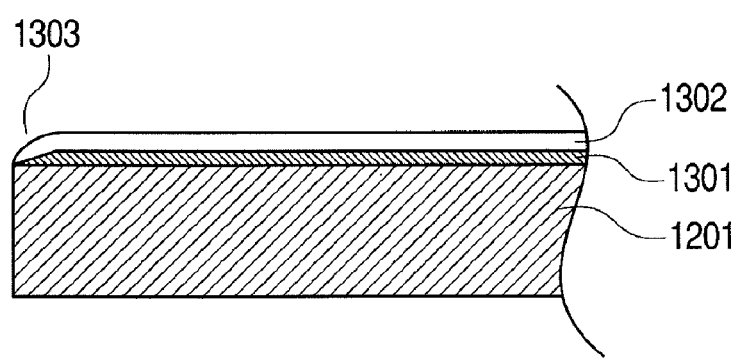
FIGS. 13A and 13B are cross-sectional diagrams of a cell periphery etching line.
Figure 13B:
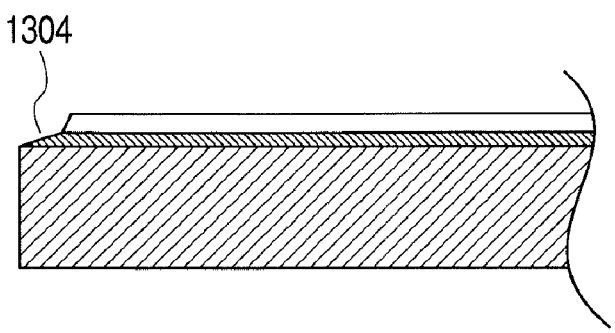
Figure 14:
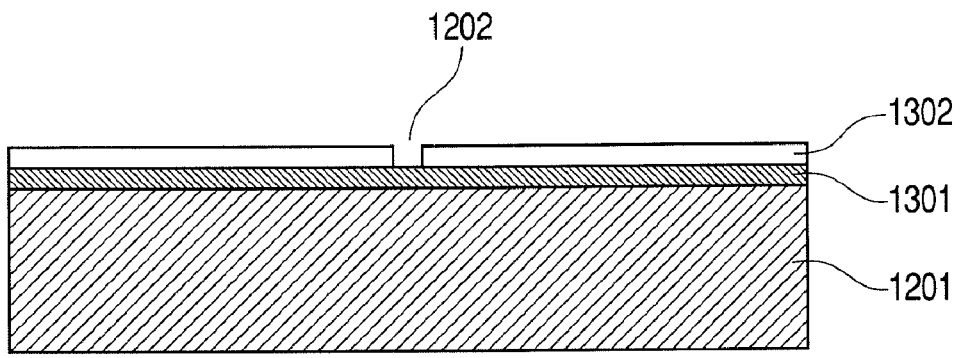
FIG. 14 is a cross-sectional diagram of an etching line inside the cell.

FIG. 5 is an illustration in which the configuration according to FIG. 3 of the present invention is applied in a continuous processing apparatus driven by a rotating drum. Compared with the conventional apparatus shown in FIG. 10, the tolerance of the positional accuracy (X, Y, Z directions) for the electrode 504 with respect to the substrate 505 is larger. In FIG. 5, reference numeral 501 denotes a working electrode, reference numeral 502 denotes an insulating member, reference numeral 503 denotes an auxiliary electrode, reference numeral 504 denotes the electrode in its entirety, reference numeral 505 denotes a substrate of the subject etching object, reference numeral 506 denotes an electrolyte, reference numeral 507 denotes an electrolysis bath, reference numeral 508 denotes an electrolysis power source and reference numeral 509 denotes a support electrode.

EXAMPLE 1

Preferable embodiments of the present invention will now be explained with reference to the drawings.

In the present example, the edge of a solar cell was etched in the following manner using an electrolytic etching apparatus having the construction shown in FIG. 3. In the present example, an auxiliary electrode was not provided.

First, a photovoltaic layer consisting of thin-film silicon and a transparent upper electrode consisting of ITO were formed on a long stainless steel substrate using a well-known roll-to-roll film deposition process. SUS 430 having a width of 360 mm and a thickness of 0.15 mm was used for the stainless steel substrate. As the back electrode, Ag was deposited by sputtering. Plasma CVD was used to grow a bottom layer comprising an n layer consisting of amorphous silicon, an i layer consisting of microcrystalline silicon and a p layer consisting of microcrystalline silicon. Plasma CVD was then used to grow a top layer, comprising an n layer consisting of amorphous silicon, an i layer consisting of amorphous silicon and a p layer consisting of microcrystalline silicon to form a double-cell structure solar battery.

In addition, ITO was deposited as an upper electrode layer by sputtering.

The semiconductor layer thus formed was about 2 μm and the ITO about 70 nm. The long solar battery substrate on which deposition had been performed was cut into 240 mm lengths using a press cutter to form a substrate 304.

Next, an electrolyte 306 consisting of sulfuric acid having an electric conductivity of 10 mS/cm was charged into an electrolysis bath 307, a substrate 305 was immersed with the upper electrode facing up and a working electrode was put into position.

Figure 16:
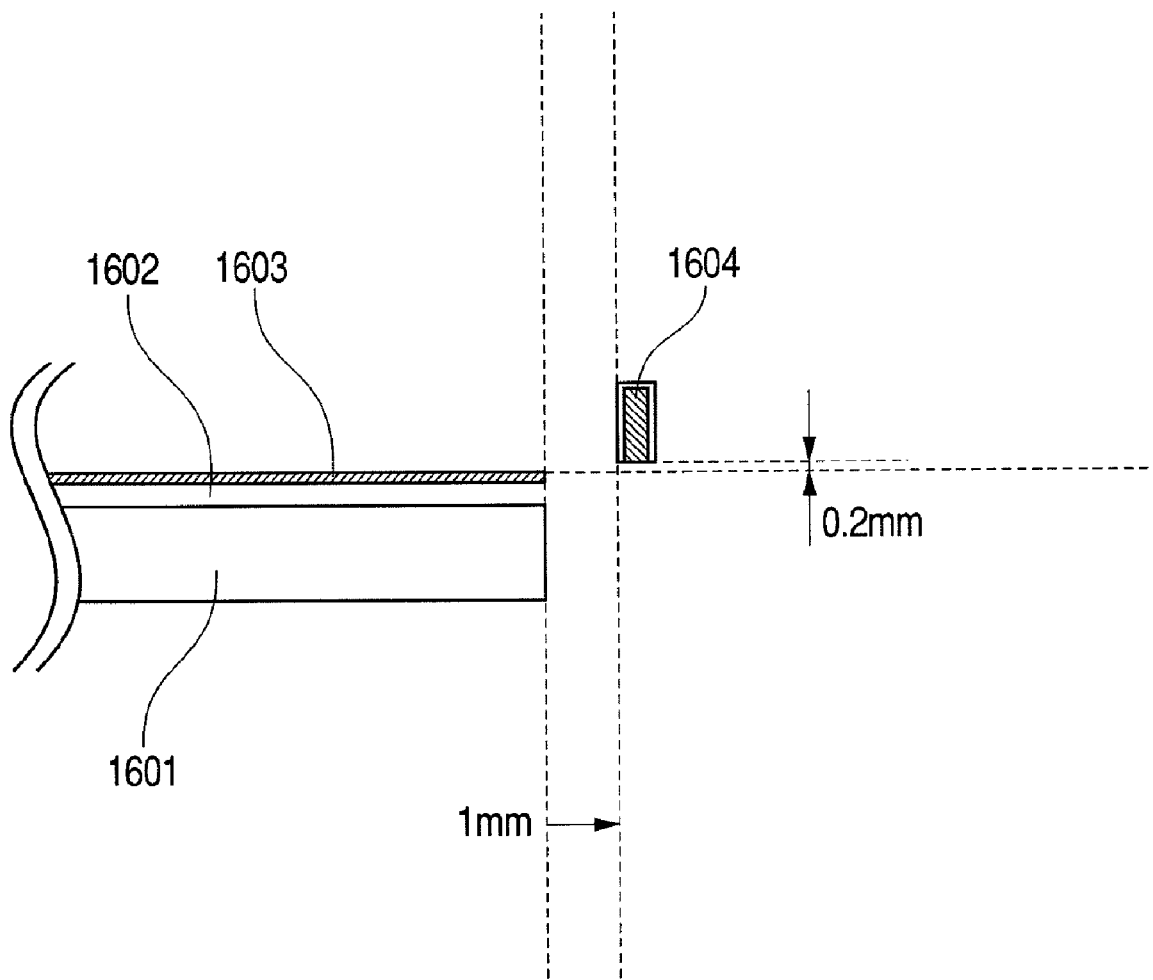
FIG. 16 is a sketch diagram illustrating the specific positional relationship between the working electrode and the substrate according to Example 1 of the present invention.

A sketch diagram illustrating the relationship between the arranged substrate and working electrode in the present example is shown in FIG. 16. A 0.2 mm thick sheet consisting of platinum was used as the working electrode 1604. To limit the source of the electric field to the lower electrode surface, a working electrode was used that had regions other than this insulated. The working electrode was positioned 1 mm (a gap of 1 mm) from the substrate end surface, and about 0.2 mm above the subject etching layer 1603. Reference numeral 1601 denotes a substrate and reference numeral 1602 a semiconductor layer.

After this, the back surface of the substrate 305 was connected to the working electrode and auxiliary electrode as in FIG. 3, the working electrode 301 acting as the plus side and the auxiliary electrode 303 and substrate 301 back surface acting as a ground, and connected to the DC constant current power source 308.

Next, using the power source 308, a 1 A current was passed through the working electrode 302 acting as the plus side. The power-on time was 1.0 seconds.

A hundred samples that had been subjected to etching in this way were prepared.

The results of evaluation for the prepared samples concerning etching line width, etching defects resulting from misalignment and etching defects resulting from air bubbles are shown in Table 1. Regarding etching line width, measurement carried out using a CCD microscope revealed that the width was a very fine 0.12±0.02 mm, whereby it was learned that a low-variation etching line was formed. In addition, visual inspection for etching defects resulting from misalignment and etching defects resulting from air bubbles did not find a single defect out of the 100 batteries.

From the above results, in the present example a fine etching line could be formed without the occurrence of etching defects resulting from misalignment.

EXAMPLE 2

A hundred solar batteries were prepared and evaluated in exactly the same manner as in Example 1, except for the position of the working electrode being changed.

The working electrode was positioned 10 mm (a gap of 10 mm) from the substrate end surface, and about 0.2 mm above the subject etching layer 2303. The required power-on time was 1.2 seconds.

The results of evaluation carried out in the same manner as in Example 1 are shown in Table 1. Regarding etching line width, measurement carried out using a CCD microscope revealed that the width was the same as that in Example 1, a very fine 0.12±0.03 mm, whereby it was learned that a low-variation etching line was formed. In addition, visual inspection for etching defects resulting from misalignment and etching defects resulting from air bubbles did not find a single defect out of the 100 batteries.

From the above results, in the present example a fine etching line could be formed even when the working electrode was further away than that in Example 1, without the occurrence of etching defects. From this result, it was made clear that with the present electrolytic etching method and apparatus, the alignment accuracy of the substrate and the working electrode does not have to be set strictly.

EXAMPLE 3

A hundred solar batteries were prepared and evaluated in exactly the same manner as in Example 1, except for the position of the working electrode being changed.

The working electrode was positioned 10 mm (a gap of 10 mm) from the substrate end surface, and about 10 mm above the subject etching layer 2403. The required power-on time was 1.3 seconds.

The results of evaluation carried out in the same manner as in Example 1 are shown in Table 1. Regarding etching line width, measurement carried out using a CCD microscope revealed that the width was a very fine 0.13±0.03 mm, whereby it was learned that a low-variation etching line was formed. In addition, visual inspection for etching defects resulting from misalignment and etching defects resulting from air bubbles did not find a single defect out of the 100 batteries.

From the above results, in the present example a fine etching line could be formed even when the working electrode was further away than those in Example 1 or 2, without the occurrence of etching defects resulting from air bubbles. From this result, it was made clear that with the present electrolytic etching method and apparatus, the alignment accuracy of the substrate and the working electrode does not have to be set strictly.

EXAMPLE 4

A hundred solar batteries were prepared and evaluated in exactly the same manner as in Example 1, except for the position of the working electrode being changed.

The working electrode was positioned 1 mm (a gap of 1 mm) from the substrate end surface, and about 0.2 mm below the subject etching layer 2503. The required power-on time was 1.8 seconds.

The results of evaluation carried out in the same manner as in Example 1 are shown in Table 1. Regarding etching line width, measurement carried out using a CCD microscope revealed that the width was a very fine 0.12±0.03 mm, whereby it was learned that a low-variation etching line was formed. In addition, visual inspection for etching defects resulting from misalignment and etching defects resulting from air bubbles did not find a single defect out of the 100 batteries.

From the above results, in the present example a fine etching line could be formed even when the working electrode was arranged below the subject etching layer, without the occurrence of etching defects resulting from misalignment or air bubbles, although processing did take some time.

EXAMPLE 5

A hundred solar batteries were prepared and evaluated in exactly the same manner as in Example 1, except for the position of the working electrode being changed.

The working electrode was positioned 10 mm (a gap of 10 mm) from the substrate end surface, and about 0.2 mm below the subject etching layer 2503. The required power-on time was 1.9 seconds.

The results of evaluation carried out in the same manner as in Example 1 are shown in Table 1. Regarding etching line width, measurement carried out using a CCD microscope revealed that the width was a very fine 0.12±0.03 mm, whereby it was learned that a low-variation etching line was formed. In addition, visual inspection for etching defects resulting from misalignment and etching defects resulting from air bubbles did not find a single defect out of the 100 batteries.

From the above results, in the present example a fine etching line could be formed in the same manner as Example 4 even when the working electrode was arranged below the subject etching layer, without the occurrence of etching defects resulting from misalignment or air bubbles, although processing did take some time.

EXAMPLE 6

A hundred solar batteries were prepared and evaluated in exactly the same manner as in Example 1, except that a 0.2 mm thick auxiliary electrode consisting of platinum was provided on one surface of the side separated from the substrate of the working electrode. The power-on time was 1.0 seconds.

The results of evaluation carried out in the same manner as in Example 1 are shown in Table 1. Regarding etching line width, measurement carried out using a CCD microscope revealed that the width was a very fine 0.09±0.02 mm, whereby it was learned that a low-variation etching line was formed. In addition, visual inspection for etching defects resulting from misalignment and etching defects resulting from air bubbles did not find a single defect out of the 100 batteries.

From the above results, by providing an auxiliary electrode in the present example a finer etching line could be formed without the occurrence of etching defects resulting from misalignment or air bubbles.

EXAMPLE 7

A hundred solar batteries were prepared and evaluated in exactly the same manner as in Example 1, except for the position of the working electrode being changed.

The working electrode was positioned 0.2 mm (a gap of 0.2 mm) from the substrate end surface, and about 0.2 mm above the subject etching layer 2703. The required power-on time was 0.7 seconds.

The results of evaluation carried out in the same manner as in Example 1 are shown in Table 1. Regarding etching line width, measurement carried out using a CCD microscope revealed that the width was a very fine 0.12±0.02 mm, whereby it was learned that a low-variation etching line was formed. No etching defects resulting from misalignment occurred.

Regarding etching defects resulting from air bubbles, 5 defects were observed out of the 100 batteries. However, compared with the below-described Comparative Examples, the yield was able to be dramatically improved.

From the above results, in the present example a fine etching line could be formed, and the processing time can be reduced. Furthermore, the yield could be substantially increased compared with conventional methods although etching defects occurred due to remained air bubbles.

EXAMPLE 8

A hundred solar batteries were prepared and evaluated in exactly the same manner as in Example 1, except for the position of the working electrode being changed.

The working electrode was positioned 0.3 mm (a gap of 0.3 mm) from the substrate end surface, and about 0.2 mm above the subject etching layer 2303. The required power-on time was 0.8 seconds.

The results of evaluation carried out in the same manner as in Example 1 are shown in Table 1. Regarding etching line width, measurement carried out using a CCD microscope revealed that the width was a very fine 0.12±0.02 mm, the same as Example 1, whereby it was learned that a low-variation etching line was formed. In addition, visual inspection for etching defects resulting from misalignment and etching defects resulting from air bubbles did not find a single defect out of the 100 batteries.

From the above results, in the present example a fine etching line could be formed without the occurrence of etching defects.

EXAMPLE 9

A hundred solar batteries were prepared and evaluated in exactly the same manner as in Example 1, except for the position of the working electrode being changed.

The working electrode was positioned 0.5 mm (a gap of 0.5 mm) from the substrate end surface, and about 0.2 mm above the subject etching layer 2303. The required power-on time was 0.8 seconds.

The results of evaluation carried out in the same manner as in Example 1 are shown in Table 1. Regarding etching line width, measurement carried out using a CCD microscope revealed that the width was a very fine 0.12±0.02 mm, the same as Example 1, whereby it was learned that a low-variation etching line was formed. In addition, visual inspection for etching defects resulting from misalignment and etching defects resulting from air bubbles did not find a single defect out of the 100 batteries.

From the above results, in the present example a fine etching line could be formed without the occurrence of etching defects.

TABLE 1

|  | Etching Width (mm) | Alignment Etching Defects | Air Bubble Etching Defects | Processing Time (seconds) |
| --- | --- | --- | --- | --- |
| Example 1 | 0.12 ± 0.02 | 0 points/100 batteries | 0 points/100 batteries | 1.0 |
| Example 2 | 0.12 ± 0.03 | 0 points/100 batteries | 0 points/100 batteries | 1.2 |
| Example 3 | 0.13 ± 0.03 | 0 points/100 batteries | 0 points/100 batteries | 1.3 |
| Example 4 | 0.12 ± 0.03 | 0 points/100 batteries | 0 points/100 batteries | 1.8 |
| Example 5 | 0.12 ± 0.03 | 0 points/100 batteries | 0 points/100 batteries | 1.9 |
| Example 6 | 0.09 ± 0.02 | 0 points/100 batteries | 0 points/100 batteries | 1.0 |
| Example 7 | 0.12 ± 0.02 | 0 points/100 batteries | 5 points/100 batteries | 0.7 |
| Example 8 | 0.12 ± 0.02 | 0 points/100 batteries | 0 points/100 batteries | 0.8 |
| Example 9 | 0.12 ± 0.02 | 0 points/100 batteries | 0 points/100 batteries | 0.9 |

COMPARATIVE EXAMPLE 1

Figure 9:
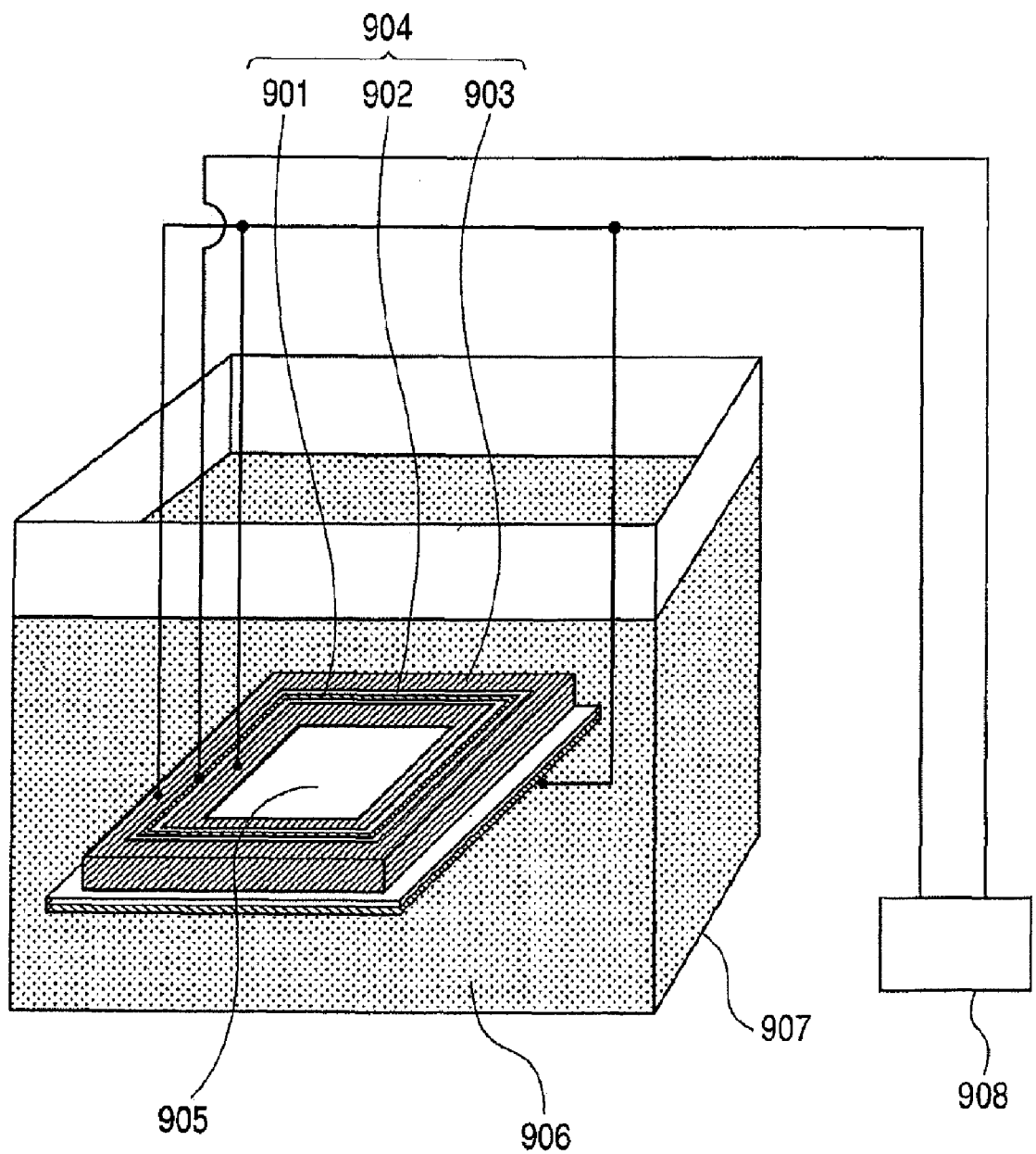
FIG. 9 is a diagram illustrating a schematic cross-section of a conventional electrolytic etching configuration.

In the present comparative example, etching was carried out in roughly the same manner as in the Examples, using the conventional electrolytic etching apparatus shown in FIG. 9. First, in the same manner as Example 1, solar battery substrates that had been cut into 240 mm×360 mm sizes were prepared. Next, after an electrolyte 906 had been charged into an electrolysis bath 907, a substrate 905 was immersed with the upper electrode facing up. An electrode 904 was then stacked on the surface of the substrate 905 leaving a 1.0 mm gap. A 0.2 mm thick sheet consisting of platinum was used as the working electrode. A laminated electrode formed having a 0.2 mm thick auxiliary electrode which consisted of platinum was employed on both sides of the working electrode through an epoxy resin. The electrode was fabricated so that the size of the circumference of the working electrode matched the size of the substrate, thereby making the size such that an etching line could be formed on the end of the substrate. After that, as shown in the drawings, the low-voltage power source 908 was connected, the working electrode 901 acting as a plus side and the auxiliary electrode 903 and back surface of substrate 905 acting as a ground, and a 20 A current was passed through. After etching had finished, washing and drying was carried out. The power-on time was 1.0 seconds.

Results of evaluation carried out in the same manner as Example 1 are shown in Table 2.

Etching line width was 0.25±0.05 mm, which was a slight bit wider, and variation also increased somewhat, although it was basically the same width as that of the working electrode of the etching electrodes. Upon visual inspection for etching defects resulting from misalignment, 3 defects were confirmed out of 100 batteries, due to the alignment accuracy of the apparatus.

Further, upon visual inspection for etching line discontinuity resulting from air bubbles, 13 defects were observed out of 100 batteries. In the technique of placing the working electrode above the subject etching object, air bubbles tended to accumulate, whereby etching defects resulting from the air bubbles frequently occurred.

COMPARATIVE EXAMPLE 2

In the present comparative example, a hundred solar batteries were prepared and evaluated in exactly the same manner as in Comparative Example 1, except for the gap between the electrode and the substrate being set at 0.5 mm.

The results of evaluation carried out in the same manner as in Example 1 are shown in Table 2. Regarding etching line width, because the gap was made smaller, a finer etching line than that in Comparative Example 1 was achieved, which was a width of 0.23±0.05 mm. Upon visual inspection for etching defects resulting from misalignment, 3 defects were confirmed out of 100 batteries, due to the alignment accuracy of the apparatus.

Further, upon visual inspection for etching line discontinuity resulting from air bubbles, 18 defects were observed out of 100 batteries. This is a higher defect rate than Comparative Example 1, which can be thought of as being because air bubbles tended to accumulate even more due to the gap being made smaller.

COMPARATIVE EXAMPLE 3

In the present comparative example, a hundred solar batteries were prepared and evaluated in exactly the same manner as in Comparative Example 1, except for a thickness of the working electrode being 0.1 mm being different from Comparative Example 2. As the electrodes, a 0.1 mm thick sheet consisting of platinum was used as the working electrode, and a laminated electrode formed having a 0.2 mm thick auxiliary electrode which consisted of platinum was employed on both sides thereof through an epoxy resin. The electrodes were fabricated so that the size of circumference of the working electrode matched the size of the substrate, thereby making the size such that an etching line could be formed on the end of the substrate.

The results of evaluation carried out in the same manner as in Example 1 are shown in Table 2.

Regarding etching line width, because the gap was made smaller, a finer etching line than that of Comparative Example 2 was achieved, which was a width of 0.13±0.08 mm. Upon visual inspection for etching defects resulting from misalignment, 5 defects were confirmed out of 100 batteries, due to the alignment accuracy of the apparatus. The reason that the number of defects resulting from misalignment was larger than Comparative Example 2 was that because the working electrode width was thinner, the accuracy required became stricter.

Further, upon visual inspection for etching line discontinuity resulting from air bubbles, 11 defects were observed out of 100 batteries.

TABLE 2

| | Etching Width (mm) | Alignment Etching Defects | Air Bubble Etching Defects | Processing Time (seconds) |
|---|---|---|---|---|
| Comparative Example 1 | 0.25 ± 0.05 | 3 points/100 batteries | 13 points/100 batteries | 1.0 |
| Comparative Example 2 | 0.23 ± 0.05 | 3 points/100 batteries | 18 points/100 batteries | 0.9 |
| Comparative Example 3 | 0.13 ± 0.08 | 5 points/100 batteries | 11 points/100 batteries | 1.0 |

This application claims priority from Japanese Patent Application No. 2003-401420 filed Dec. 1, 2003, and No. 2004-321641 filed Nov. 5, 2004 which are hereby incorporated by reference herein.

What is claimed is:

1. An electrolytic etching method of a substrate having a subject etching layer on its surface, the method comprising:
providing a fixed gap from a peripheral surface of a substrate and outside a periphery of the substrate such that no part of a working electrode is directly above the subject etching layer; and
passing current between the substrate and the working electrode,
wherein an auxiliary electrode is provided via an insulating member on at least one surface of the working electrode.

2. The electrolytic etching method according to claim 1, wherein an electric potential of the auxiliary electrode is a substantively different electric potential from an electric potential of the working electrode.

3. A method of producing a solar battery comprising:
a substrate;
a transparent electrode provided on a surface of the substrate; and
a working electrode,
the method comprising:
disposing a working part of the working electrode so as to provide a fixed gap from a peripheral surface of the substrate and outside a periphery of the substrate such that the working part is not present above a surface other than the periphery of the substrate; and
passing current between the substrate and the working electrode to conduct electrolytic etching at the transparent electrode,
wherein an auxiliary electrode is provided via an insulating member on at least one surface of the working electrode.

* * * * *